US012003079B2

(12) United States Patent
Calhau Gonçalves et al.

(10) Patent No.: US 12,003,079 B2
(45) Date of Patent: Jun. 4, 2024

(54) ARC FAULT PROTECTED ELECTRIC CONVERTER SYSTEM

(71) Applicant: VESTAS WIND SYSTEMS A/S, Aarhus N. (DK)

(72) Inventors: Luis Miguel Calhau Gonçalves, Aarhus C (DK); Kenneth G. Hansen, Kjellerup (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 140 days.

(21) Appl. No.: 17/700,246

(22) Filed: Mar. 21, 2022

(65) Prior Publication Data

US 2022/0311223 A1  Sep. 29, 2022

(30) Foreign Application Priority Data

Mar. 23, 2021 (DK) .......................... PA 2021 70126

(51) Int. Cl.
*H02B 13/025* (2006.01)
*F03D 80/80* (2016.01)
(Continued)

(52) U.S. Cl.
CPC .......... *H02B 13/025* (2013.01); *F03D 80/82* (2016.05); *H02B 1/565* (2013.01); *H02J 3/381* (2013.01); *H05K 5/06* (2013.01); *H02J 2300/28* (2020.01)

(58) Field of Classification Search
CPC ... H02B 13/025; H02B 13/1565; F03D 80/50; F03D 80/82; H02J 3/381; H02J 2300/28; H05K 5/06

(Continued)

(56) References Cited

U.S. PATENT DOCUMENTS

2009/0212022 A1  8/2009  Josten et al.
2009/0322083 A1*  12/2009  Wagoner ............... H02P 9/006
290/44

(Continued)

FOREIGN PATENT DOCUMENTS

DE        19645304 C1    10/1997
DE    102010007136 A1    8/2011
(Continued)

OTHER PUBLICATIONS

Danish Patent and Trademark Office, 1st Technical Examination including The Search Report and Search Opinion for Application PA 2021 70126 dated Sep. 22, 2021.

(Continued)

*Primary Examiner* — Kevin J Comber
(74) *Attorney, Agent, or Firm* — Patterson + Sheridan, LLP

(57) ABSTRACT

A wind turbine with an electric converter module having a first section forming a first enclosure capable of withstanding a pressure from an arc flash inside the first enclosure. The first enclosure houses an electric protective device electrically connected between a first electric conductor and the second electric conductor. A second section is arranged adjacent to the second side wall of the first section, and forms a second enclosure housing an electric converter system connected to the second electric conductor and a third electric conductor to allow conversion of electric power from the third electric conductor to electric power to the second electric conductor. A door in the second section serves to allow service personnel to access components of the electric converter system from outside the enclosure.

13 Claims, 4 Drawing Sheets

(51) Int. Cl.
*H02B 1/56* (2006.01)
*H02J 3/38* (2006.01)
*H05K 5/06* (2006.01)

(58) Field of Classification Search
USPC .......................................................... 361/1
See application file for complete search history.

(56) References Cited

U.S. PATENT DOCUMENTS

| | | | | |
|---|---|---|---|---|
| 2013/0026139 | A1* | 1/2013 | Becker | F03D 13/20 |
| | | | | 218/157 |
| 2014/0131090 | A1* | 5/2014 | Gingrich | H02B 1/565 |
| | | | | 174/560 |
| 2014/0225369 | A1* | 8/2014 | Bodewes | H02P 9/00 |
| | | | | 290/44 |
| 2016/0156163 | A1* | 6/2016 | Faber | H02B 13/025 |
| | | | | 361/605 |
| 2017/0064863 | A1* | 3/2017 | Zeng | H02B 13/025 |
| 2020/0059074 | A1 | 2/2020 | Hansen et al. | |
| 2020/0284243 | A1 | 9/2020 | Konitz | |
| 2020/0296848 | A1 | 9/2020 | Hansen et al. | |

FOREIGN PATENT DOCUMENTS

| | | |
|---|---|---|
| EP | 2141788 A2 | 1/2010 |
| EP | 2565443 A1 | 3/2013 |
| WO | 2015009291 A2 | 1/2015 |
| WO | 2016156369 A1 | 10/2016 |

OTHER PUBLICATIONS

European Patent Office, Extended European Search Report for Application 22162903.3-1002 dated Aug. 22, 2022.

* cited by examiner

ARC FAULT PROTECTED ELECTRIC CONVERTER SYSTEM

FIELD OF THE INVENTION

The present invention relates to the field of electric power technology, more specifically to the field of protection for arc faults of an electric converter system. More specifically, the invention relates to an electric converter system for a wind turbine which is protected against arc faults.

BACKGROUND OF THE INVENTION

An arc flash is a complex phenomenon that can happen when for some reason a breakage of insulation between two conductors fails. An arc fault creates an explosion that will develop poisonous gases, pressure waves, intense light, an air temperature increase up to 35.000° F., and an expansion of the copper up to 67.000 times (transformation from solid copper to plasma/ionized gasses).

Thus, in e.g. a wind turbine electric system, an arc fault may have serious consequences, both on human lives and/or equipment, as an arc can destroy neighbouring systems.

Due to this some standards and regulations in the world already demand today preventive measures, like keeping a safe distance from energized electrical systems, work with special Personal Protective Equipment (PPE) or work on non-energized systems.

This phenomenon and the associated work restrictions represent a challenge for wind turbines, first because the amount of electrical power available in wind turbines is very high, creating the possibility for very strong arc flash events and second because wind turbines (nacelles, towers, etc.) are areas with confined space, making it difficult to respect safety distances, to work with unpractical PPE and where due to the reduced space between components, an arc fault has the potential to destroy the entire power cabinet with risk of propagating the fault and destroy the complete wind turbine.

At the same time, to disconnect the entire wind turbine from the electric grid to do maintenance is expensive and time consuming, e.g. involving the use of a service generator to ensure electrical power to critical functions like the Yaw system, pitching system, brake system or electrical safety systems. Equally, power will be needed by a service generator for maintenance/service purposes like the crane, light, lift and power sockets.

SUMMARY OF THE INVENTION

Thus, according to the above description, it is an object of the present invention to provide an electric converter system for wind turbines which allows safe service of converter components without the need to disconnect the entire wind turbine from the electric grid.

In a first aspect, the invention provides wind turbine comprising a rotor blade system, an electric generator connected to be driven by the rotor blade system, a tower with a nacelle for housing the electric generator, and an electric converter module comprising a first section comprising a top part, a bottom part and four side walls arranged between the top and bottom parts forming a first enclosure, wherein the four sidewalls are arranged to withstand a pressure of an arc flash inside the first enclosure, wherein a first electric conductor arranged for electric grid connection penetrates a first side wall of the first section, and wherein a second electric conductor penetrates a second side wall opposite the first side wall by means of a sealing mechanism of the second side wall, and wherein the first enclosure houses at least one electric protective device electrically connected between the first electric conductor and the second electric conductor, and a second section arranged adjacent to the second side wall of the first section, wherein the second section forms a second enclosure housing an electric converter system connected at one end to the second electric conductor and at the opposite end to a third electric conductor and being arranged to convert electric power from the third electric conductor to electric power to the second electric conductor, wherein the second section has at least one door serving to allow service personnel to access components of the electric converter system from outside the enclosure, wherein the electric converter system is connected to convert electric power from the electric generator and to apply converted electric power to an electric grid via the first electric conductor.

Such electric converter module is advantageous in wind turbines. Since the first section for grid connection has arc fault safe side walls, a possible arc fault blast will be directed upwards, e.g. by a dedicated pressure release top part, thus hindering damage on the second adjacent section where the converter system is located. This means that grid connection in the first section is acceptable while service personnel can access the converter section for maintenance. Thus, electric power from the grid is still available via the first section even though the converter output is disconnected from the grid. Thereby, electric power is available for powering the necessary equipment for operation of the wind turbine during service in the converter section without the need to start a combustion generator or the like to provide power when the wind turbine power generation is inactive. This helps to facilitate service and reduce service costs on the converter system, and further, exhaust gas from a combustion generator during service can be eliminated.

Furthermore, the electric converter module is advantageous, since it can be manufactured as standard module parts which can be assembled to form the entire module. Especially, the first section can be a standard module which can be mass produced and used together with a range of different converter sections rated for different electric power levels.

The electric converter module can be rather compact and is thus suitable for location inside the nacelle of the wind turbine. However, the module may be located at other positions inside the wind turbine or outside the wind turbine, such as on the ground adjacent to the wind turbine tower.

In the following, preferred embodiments and features will be described.

The electric protective device may especially be an electric circuit breaker, an electric fuse or a similar device serving to provide electric protection.

The first enclosure may house at least one electrical protective device, e.g. a circuit breaker, connected between the first electric conductor and an auxiliary conductor accessible outside the first enclosure. Especially, the wind turbine preferably comprises auxiliary equipment necessary for operation of the wind turbine in a de-energized state of the electric converter system, wherein at least a part of said auxiliary equipment, or all of said auxiliary equipment, is arranged for electric grid connection to the auxiliary electric conductor. Thus, when the converter system is de-energized and thus inactive during service, power can be provided from the grid via the first section from the auxiliary conductor. Thus, power can be provided for auxiliary equipment such as yaw system, pitching system, brake system or electrical safety systems, as well as power for maintenance/service purposes like crane, light, lift and power socket brake system etc.

Preferably, the first section may have a top part with a pressure release or pressure relieve mechanism arranged to release pressure in case of an arc flash inside the first enclosure. Thereby it is ensured that a blast inside the first enclosure is directed upwards, thus hindering damage of equipment or any person positioned near the side walls of the first section, e.g. a person inside the second section. Such top mounted pressure release mechanism helps to relax the demands for the required strength of the side walls to withstand an arc flash. In preferred embodiments, the pressure release mechanism comprises an arc vent arranged to release pressure in response to a pressure exceeding a predetermined threshold. Such arc vent may be implemented by a thin flexible metal plate design to brake (rip off) on a rupture line, when a specific pressure is reached. In other embodiments, a door or other type of opening mechanism can be used for this purpose, e.g. a door with a spring mechanism to ensure that the door mechanism is closed under normal conditions, while allowing the door to open for pressure release when the force of the pressure in the enclosure exceeds the spring force. However, other pressure release or pressure relieve mechanisms may be used, especially with the purpose of directing a pressure wave upwards and away from the sidewalls.

Preferably, the electric converter module comprises a first air cooling system to provide cooling inside the first enclosure and a second air cooling system to provide cooling inside the second enclosure, wherein the first and second air cooling systems have separate air ducts, so as to prevent pressure from an arc flash inside the first enclosure to reach the second enclosure. In this way cooling can be provided without causing a pressure wave in case of an arc fault in the first enclosure to propagate via the cooling ducts.

It may be preferred to implement the first section as a stand-alone module arranged to be assembled with the second section. In this way the first section can be mass-produced and be used with converter sections with various converter configurations, e.g. various different converter sections with various electric power ratings. Especially, the side walls and the top part form a rectangular box, wherein the first electric conductor extends from a middle part of the first side wall, and wherein the second electric conductor extends from an upper part of the second side wall.

The first, second and third conductors may each comprise at least three electrically separated conductors, and wherein the electric converter system is arranged for three-phase electric conversion. The conductors and the electric isolation between the conductors may be implemented to allow low, middle or high voltage levels.

In preferred embodiments, at least the second side wall of the first enclosure comprises a metal sheet, e.g. with a thickness of 1-5 mm, such as steel, with an opening in which the sealing mechanism allows the second electric conductor to penetrate, wherein the sealing mechanism is arranged to withstand a pressure caused by an arc flash inside the first enclosure.

The sealing mechanism and the side wall should provide an airtight or at least substantially airtight separation between the first and second sections. The sealing should be flexible to be airtight around the second conductor, electrically isolating and temperature resistant. Especially, the sealing mechanism may be formed by a metal frame and an electrically isolating material, e.g. a silicone material or the like, arranged to withstand a temperature of at least 100° C. or any temperature expected during an arc fault.

In preferred embodiments the electric converter module comprises a third section with side walls forming a third enclosure, and wherein the side walls are arranged to withstand an arc flash inside the third enclosure, wherein the third enclosure houses at least one electric protective device, e.g. a circuit breaker, electrically connected between the third electric conductor and a fourth electric conductor arranged for electric connection to an electric source, e.g. an electric generator of a wind turbine, wherein the third electric conductor penetrates a first side wall of the third enclosure by means of a sealing mechanism of the first side wall. Such third section allows an arc fault secure connection to an electric source, and thus when the electric input of the converter is disconnected, service in the second section is still safe in case of an accidental arc fault in the third section.

In preferred embodiments, the first, second and third sections are assembled to form a box shaped module.

The invention can be applied to any wind turbine size from a few kW to several MW. Especially, the total electric power capacity of the electric converter system may be at least 1 MW, such as 1-12 MW or 10-20 MW or more. Especially, the electric converter system may be arranged for handling power input from a wind power generator which is configured for at least 70%, such as at least 80%, such as 90%, such as 100% of the total electric power capacity of the electric converter system.

In a second aspect, the invention provides a method of manufacturing an electric converter module, the method comprising manufacturing a first module part providing a first section formed by a top part, a bottom part and four side walls arranged between the top and bottom parts, forming a first enclosure, wherein the first enclosure houses at least one electric protective device, e.g. a circuit breaker, electrically connected between first and second electric conductors which penetrate respective opposite first and second side walls of the first enclosure, wherein the four sidewalls are arranged to withstand an arc flash inside the first enclosure, manufacturing a second module part providing a second section forming a second enclosure housing an electric converter system arranged for conversion of electric power between a third electric conductor accessible outside the second enclosure and a connection to the second electric conductor of the first module part through a side wall part, wherein the second section has at least one door serving to allow service personnel to access components of the electric converter system from outside the enclosure, and assembling the first and second module parts to provide the electric converter module. Especially, the method is advantageous for manufacturing an electric converter module for use to convert electric energy generated by a wind turbine.

It is to be understood that the same advantages and preferred embodiments and features described for the first aspect apply as well for the second aspect, and the aspects may be mixed in any way.

BRIEF DESCRIPTION OF THE FIGURES

The invention will now be described in more detail with regard to the accompanying figures of which

The figures illustrate specific ways of implementing the present invention and are not to be construed as being limiting to other possible embodiments falling within the scope of the attached claim set.

DETAILED DESCRIPTION OF THE INVENTION

Figure 1:
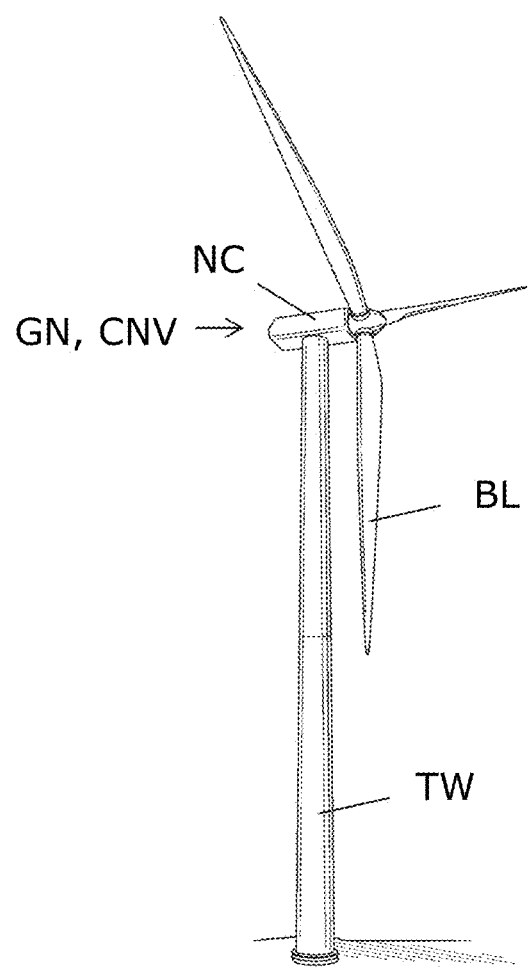
FIG. 1 illustrates a wind turbine system embodiment with an electric converter module inside the nacelle.

FIG. 1 illustrates a wind turbine with typically two or three rotor blades BL which drive an electric generator GN located inside the nacelle NC on top of a tower TW. Such wind turbine may generate an electric power of at least 1 MW, such as 2-10 MW, or more. In the shown embodiment, the wind turbine generator GN is connected to an electric converter module according to the invention inside the nacelle. This module has an electric converter system serving to convert electric power from the electric generator GN to deliver electric power to an electric grid via a switchgear, e.g. at a Low, Medium or High Voltage level.

Figure 2:
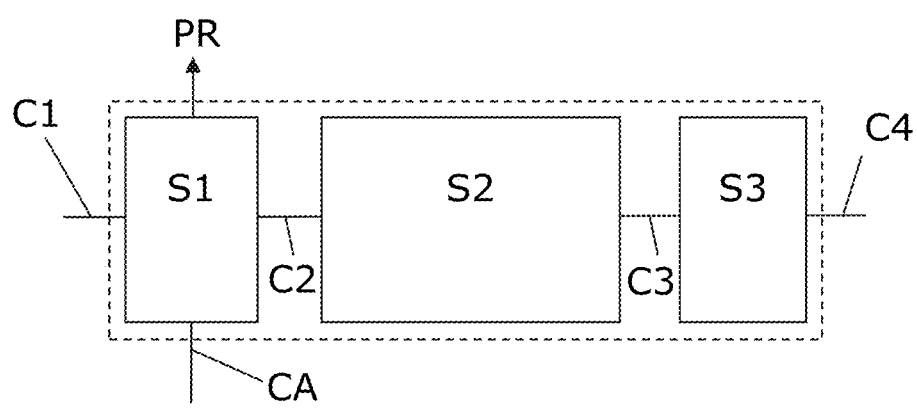
FIG. 2 illustrates a configuration of one embodiment.

FIG. 2 shows a block diagram of a configuration of an embodiment of an electric converter module (dashed line). In this embodiment, the module if formed by a cascade of three sections: a grid side section S1, a converter section S2, and a generator side section S3. The three sections S1, S2, S3 can be manufactured and tested separate as standard modules, e.g. to allow mass production especially of the grid side section S1 and the generator side section S3. The converter section S2 can e.g. be sized to house the required number of electric converter modules to match the actual rated electric power. The three sections S1, S2, S3 can be assembled to form a module which can be transported as one single unit, e.g. the module being designed to have the size of a standard container or the like. The module may be designed for location inside the nacelle, or another position inside the tower, or outside the tower, e.g. on the ground near the tower.

The first section S1 has a top, a bottom and four sidewalls connected to form an enclosure housing two circuit breakers, e.g. other types of electric protective device(s). Especially, the sidewalls are formed with a strength arranged to withstand a pressure of an arc flash inside the enclosure of the first section S1. The top has an opening mechanism to allow a pressure release PR in case of an arc flash inside the first section S1. A first electric conductor C1 penetrates one side wall. This conductor C1 serves for electric grid connection, and one circuit breaker inside the enclosure allows breaking of connection to the second electric conductor C2 which is connected to an output of the electric converter system in the converter section S2. Thus, with this circuit breaker, the electric output from the converter can be disconnected from the grid. However, a second circuit breaker inside the grid section S1 allows breaking of grid connection to an auxiliary electric conductor CA. By individual control of the circuit breakers, the converter system can be off-grid, while the auxiliary electric conductor CA can deliver electric power from the grid to power equipment necessary for operation of the wind turbine in an inactive mode, e.g. for service of the electric converter system inside S2.

Especially the side wall separating S1 and S2 is preferably designed to have a significant strength, e.g. comprising a metal sheet, e.g. a steel sheet with a thickness of 2.5 mm or the like. The metal sheet has an opening to allow the second conductor to penetrate via a sealing mechanism, and this sealing mechanism is preferably also designed with a strength to withstand the pressure of an arc flash inside the grid section S1.

Altogether, the first section S1 is designed to be arc fault safe in case of an accidental arc on the incoming electric conductor C1 which may connect to a grid voltage of e.g. 10 kV, 15 kV, 20 kV, 33 kV, 36 kV, 66 kV or any voltage level, depending on the actual design. However, with a LV/HV transformer between the grid and the first electric conductor C1, the output of the converter may be LV, i.e. below 1 kV. An arc fault is acceptable inside the first section S1 without causing any significant harm on equipment or any person inside the second section S2. This allows service personnel to safely perform maintenance on the converter system in the second section S2 while the first section S1 stays connected to the grid and thus delivers power via an auxiliary electric conductor CA to power equipment necessary for normal operation of the wind turbine with its electric generator disconnected, e.g. yaw system, pitching system, brake system or electrical safety systems, as well as power for maintenance/service purposes like crane, light, lift and power socket brake system etc. Hereby, the need for a diesel driven or other combustion engine service generator is eliminated during service, still in a safe manner.

The generator side section S3 has a third electric conductor C3 penetrating a side wall of this section, and inside the enclosure a circuit breaker, e.g. other electric protective device(s), allows disconnecting between the third electric conductor C3 and a fourth electric conductor C4 penetrating another side wall arranged for electric connection to the electric generator of the wind turbine. As for the grid section S1, the generator side section S3 can have side walls designed with a strength to be arc fault safe, e.g. involving also a top mounted pressure release mechanism. Hereby this section can also be designed to eliminate any significant harm on the second section in case of an arc fault inside the generator side section S3.

Figure 3:
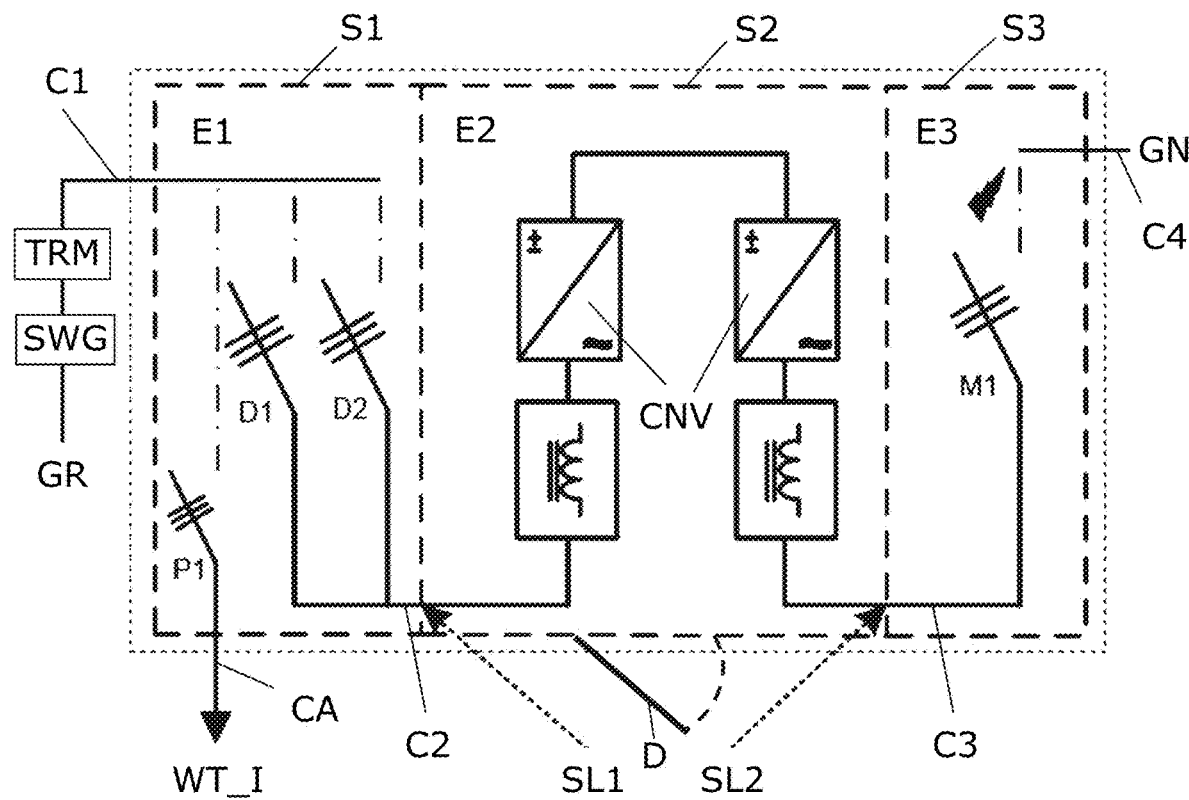
FIG. 3 illustrates a configuration of another embodiment.

FIG. 3 shows in more details and embodiment where the three sections S1, S2, S3 with their respective enclosures E1, E2, E3 are arranged in a cascade with adjacent side walls, thus forming one module. In one end of the module the grid conductor C1 connects to the grid GR via a transformer TRM and a switch gear SWG. Circuit breakers D1, D2 or other electric protective device(s), allow controllable connection or disconnection of the converter output conductor C2 to grid GR, while circuit breaker P1 allows controllable connection or disconnection of auxiliary conductor CA to the grid GR for powering auxiliary or internal equipment WT_I of the wind turbine.

The second section S2 has a door D to allow a service person to access components of the electric converter system CNV for maintenance. The electric converter system CNV is here show as an AC to AC converter, but it may likewise be an AC to DC or DC to AC converter. The second enclosure E2 may also contain further equipment than the converter itself.

The generator side section S3 has a circuit breaker M1 serving to connect or disconnect the generator electric conductor C4 from the converter input conductor C3. The generator side section S3 is place in the opposite end of the module than the grid section S1 and with the converter section S2 arranged in between the two S1, S3.

Pressure safe sealing mechanisms SL1, SL2 for sealing the necessary openings for the electric conductors C2, C3 serve to ensure that not harmful pressure will reach the enclosure E2 of the converter section S2 even in case of an arc fault in any of the adjacent section S1, S3.

Figure 4:
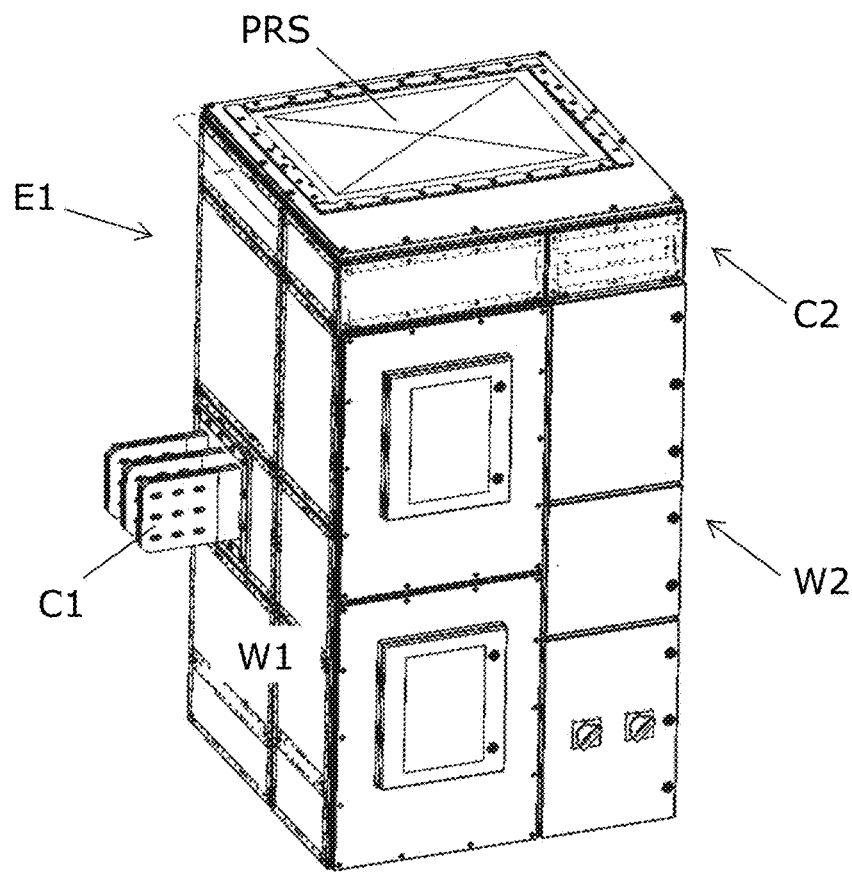
FIG. 4 illustrates an example of a pre-manufactured module part to be assembled with further parts to form an electric converter module.

FIG. 4 illustrates a 3D view of a specific embodiment of a grid side section, namely a box shaped cabinet forming one module part which can be pre-manufactured and tested before being assembled with the converter section S2 and the generator side section S3 explained above. Visible here is a first side wall W1 with the grid side conductor C1 extending and penetrating via sealing to the enclosure E1 inside the cabinet. The grid side conductor C1 can, as shown extend from a middle or central part between top and bottom of the first side wall W1. On the opposite of the first side wall W1, a second side wall W2 (not visible) is arranged to face a side wall to the converter section, and the converter output conductor C2 (also not visible) extends and penetrates through the side wall W2. Especially, it may be preferred that the converter output conductor C2 extends from an upper part of the second side wall W2, i.e. hear the top of the cabinet.

In preferred versions, the overall height of the cabinet may be such as 1.2-3.0 times an overall width of the cabinet, and/or the overall height of the cabinet may be such as 1.2-3.0 times an overall length of the cabinet.

The major area of the top of the cabinet has a pressure release section PRS which can open to release pressure in case the pressure inside the enclosure E1 exceeds a threshold, e.g. in case of an arc fault. E.g. this pressure release section PRS can be implemented as an arc vent, e.g. as a flexible metal sheet designed to rip-off when a certain predetermined pressure is exceeded inside the enclosure E1. In this way a blast will be directed upwards, and thus away from the side walls of the first section. The bottom (not visible) of the cabinet may be formed to withstand the pressure of an arc flash inside the enclosure E1. Further, via the bottom a duct or pipe may guide cooling air into the enclosure E1.

Figure 5:
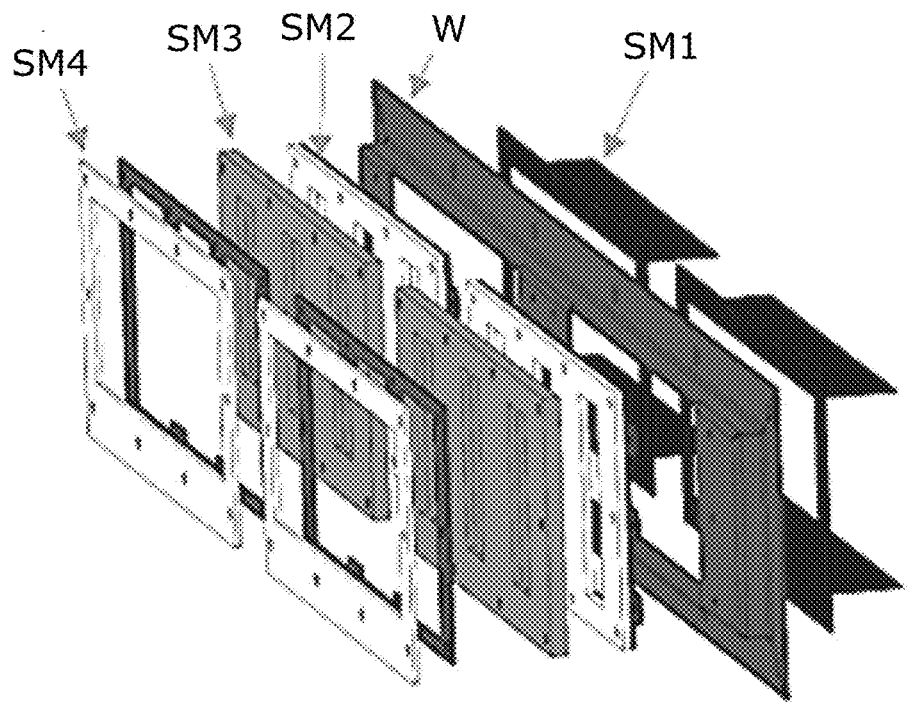
FIG. 5 illustrates an example of implementation of an arc flash safe sealing for electric conductors.

FIG. 5 illustrate an example of implementation of a sealing for sealing of the electric conductors C2, C3, referring to the previous figures, where these conductors C2, C3, e.g. busbars, penetrate through a side wall, and where a pressure safe sealing is required. Further, being in contact with the electric conductors, the sealing material should preferably withstand a temperature of at least 100° C.

The sealing must electrically isolate the busbar C2, C3 from the (metal) cabinet frame structure, to keep the needed electrical clearance, also the sealing must provide isolation between the conductors of the electric phases. On the other side, the sealing must be strong enough to sustain an arc blast, and to withstand rather high temperatures on the busbar C2, C3—both during normal operation, but also during a fault where higher temperatures may occur. Further, the sealing should provide an airtight sealing between the first and second sections. It may be preferred to provide a mixed construction of metal frame and a silicone sealing (or similar material) that provides electrical isolation and holds the high temperatures.

In the shown example in FIG. 5, the wall W is made of metal, e.g. 1-4 mm steel, and has an opening in which a cabinet frame isolator element SM1 is inserted. A gasket support SM2 serves to support the gasket SM3 which is in contact with the electric conductor parts. Finally, a flange SM4 fixes the gasket SM3 onto the gasket support SM2.

Figure 6:
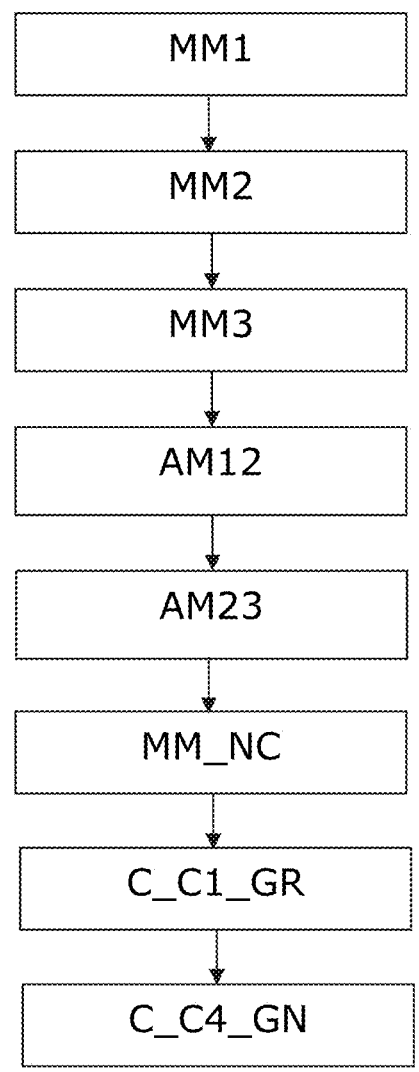
FIG. 6 illustrates steps of a method embodiment.

FIG. 6 illustrates steps of an embodiment for a method for manufacturing an electric converter module, e.g. a module such as described above. In this embodiment, the method involves manufacturing MM1 a first module part providing a first section formed by a top part, a bottom part and four side walls arranged between the top and bottom parts, forming a first enclosure, wherein the first enclosure houses at least one electric protective device, e.g. a circuit breaker, electrically connected between first and second electric conductors which penetrate respective opposite first and second side walls of the first enclosure, wherein the four sidewalls are arranged to withstand an arc flash inside the first enclosure. Such grid side module part may be mass-produced, since it can be used for a wide range of converter systems for wind turbines with different power ratings, and thus with differently dimensioned electric converters.

Next, manufacturing MM2 a second module part providing a second section forming a second enclosure housing an electric converter system arranged for conversion of electric power between a third electric conductor accessible outside the second enclosure and a connection to the second electric conductor of the first module part through a side wall part, wherein the second section has at least one door serving to allow service personnel to access components of the electric converter system from outside the enclosure. This converter module part can be dimensioned according to the power rating and e.g. the number of converter modules necessary for the rated power.

Further, assembling the first and second modules AM12 the first and second module parts to provide the electric converter module, or at least a pre-assembly.

The method further comprises manufacturing MM3 a third module with side walls and forming a third enclosure, and wherein the side walls are arranged to withstand an arc flash inside the third enclosure, wherein the third enclosure houses at least one electric circuit breaker electrically connected between the third electric conductor and a fourth electric conductor arranged for electric connection to an electric source, wherein the third electric conductor penetrates a first side wall of the third enclosure by means of a sealing mechanism of the first side wall, and wherein the fourth electric conductor penetrates a second side wall opposite the first side wall.

Next, assembling AM23 the second and third sections, thus now forming the entire module as a cascade of the first, second and third sections to be one single unit.

Next, moving MM_NC the module to a wind turbine, e.g. into the nacelle of the wind turbine, electrically connecting C_C1_GR the first electric conductor to an electric grid, and electrically connecting the fourth electric conductor C_C4_GN to the electric generator of the wind turbine.

To sum up, the invention provides a wind turbine with an electric converter module, e.g. for converting electric power from a wind turbine generator, the module comprising a first section (S1) with top, a bottom and four side walls to form a first enclosure (E1). The sidewalls can withstand a pressure from an arc flash inside the first enclosure (E1). A first electric conductor (C1) arranged for electric grid (GR) connection penetrates a first side wall (W1), and wherein a second electric conductor (C2) penetrates a second side wall (W2) opposite the first side wall (W1) by means of a sealing mechanism (SL1) of the second side wall (W2), and wherein the first enclosure (E1) houses an electric protective device (D1, D2) electrically connected between the first electric conductor (C1) and the second electric conductor (C2), and a second section (S2) arranged adjacent to the second side wall (W2) of the first section (S1), wherein the second section (S2) forms a second enclosure (E2) housing an electric converter system (CNV) connected at one end to the second electric conductor (C2) and at the opposite end to a third electric conductor (C3) to allow conversion of electric power from the third electric conductor (C3) to electric power to the second electric conductor (C2). A door in the second section (S2) serves to allow service personnel to access components of the electric converter system (CNV) from outside the enclosure (E2). The arc safe first section (S1) allows grid connection for powering necessary equipment in the wind turbine while the converter is disconnected and de-energized during service. Thus safe service of the converter system can be performed without the need for power from a combustion generator.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A wind turbine comprising a rotor blade system, an electric generator connected to be driven by the rotor blade system, a tower with a nacelle for housing the electric generator, and
an electric converter module comprising:
a first section comprising a top part, a bottom part and four side walls arranged between the top and bottom parts forming a first enclosure, wherein the four side walls are arranged to withstand a pressure of an arc flash inside the first enclosure, wherein a first electric conductor arranged for electric grid connection penetrates a first side wall of the first section, and wherein a second electric conductor penetrates a second side wall opposite the first side wall by means of a sealing mechanism of the second side wall, and wherein the first enclosure houses at least one electric protective device electrically connected between the first electric conductor and the second electric conductor; and
a second section arranged adjacent to the second side wall of the first section, wherein the second section forms a second enclosure housing an electric converter system connected at one end to the second electric conductor and at the opposite end to a third electric conductor and being arranged to convert electric power from the third electric conductor to electric power to the second electric conductor, wherein the second section has at least one door serving to allow service personnel to access components of the electric converter system from outside the enclosure,
wherein the electric converter system is connected to convert electric power from the electric generator and to apply converted electric power to an electric grid via the first electric conductor,
wherein the first enclosure houses at least one electric protective device connected between the first electric conductor and an auxiliary conductor accessible outside the first enclosure; and
auxiliary equipment necessary for operation of the wind turbine in a de-energized state of the electric converter system, wherein at least a part of said auxiliary equipment is arranged for electric grid connection to the auxiliary electric conductor when the wind turbine is in the de-energized state.

2. The wind turbine according to claim 1, wherein the first section has a top part with a pressure release mechanism arranged to release pressure in case of an arc flash inside the first enclosure.

3. The wind turbine according to claim 2, wherein the pressure release mechanism comprises an arc vent arranged to release pressure in response to a pressure exceeding a predetermined threshold.

4. The wind turbine according to claim 1, comprising a first air cooling system to provide cooling inside the first enclosure and a second air cooling system to provide cooling inside the second enclosure, wherein the first and second air cooling systems have separate air ducts, so as to prevent pressure from an arc flash inside the first enclosure to reach the second enclosure.

5. The wind turbine according to claim 4, wherein the side walls and the top part form a rectangular box, wherein the first electric conductor extends from a middle part of the first side wall, and wherein the second electric conductor extends from an upper part of the second side wall.

6. The wind turbine according to claim 1, wherein the first section is implemented as a stand-alone module arranged to be assembled with the second section.

7. The wind turbine according to claim 1, wherein the first, second and third conductors each comprise at least three electrically separated conductors, and wherein the electric converter system is arranged for three-phase electric conversion.

8. The wind turbine according to claim 1, at least the second side wall of the first enclosure comprises a metal sheet with an opening in which the sealing mechanism allows the second electric conductor to penetrate, wherein the sealing mechanism is arranged to withstand a pressure caused by an arc flash inside the first enclosure.

9. The wind turbine according to claim 1, wherein the sealing mechanism is formed by a metal frame and an electrically isolating material arranged to withstand a temperature of at least 100° C.

10. The wind turbine according to claim 1, comprising a third section with side walls forming a third enclosure, and wherein the side walls are arranged to withstand an arc flash inside the third enclosure, wherein the third enclosure houses at least one electric protective device electrically connected between the third electric conductor and a fourth electric conductor arranged for electric connection to an electric source, wherein the third electric conductor penetrates a first side wall of the third enclosure by means of a sealing mechanism of the first side wall.

11. The wind turbine according to claim 1, wherein the electric protective device connected inside the first enclosure comprises at least one of: an electric fuse, or an electric circuit breaker.

12. The wind turbine according to claim 1, wherein the electric converter module is arranged inside the nacelle.

13. A method of manufacturing an electric converter module, the method comprising:

manufacturing a first module part providing a first section formed by a top part, a bottom part and four side walls arranged between the top and bottom parts, forming a first enclosure, wherein the first enclosure houses at least one electric protective device electrically connected between first and second electric conductors which penetrate respective opposite first and second side walls of the first enclosure, wherein the four side walls are arranged to withstand an arc flash inside the first enclosure, wherein the first enclosure houses at least one electric protective device connected between the first electric conductor and an auxiliary conductor accessible outside the first enclosure;

manufacturing a second module part providing a second section forming a second enclosure housing an electric converter system arranged for conversion of electric power between a third electric conductor accessible outside the second enclosure and a connection to the second electric conductor of the first module part through a side wall part, wherein the second section has at least one door serving to allow service personnel to access components of the electric converter system from outside the enclosure;

providing auxiliary equipment necessary for operation of a wind turbine in a de-energized state of the electric converter system, wherein at least a part of said auxiliary equipment is arranged for electric grid connection to the auxiliary electric conductor when the wind turbine is in the de-energized state; and assembling the first and second module parts to provide the electric converter module.

\* \* \* \* \*